(12) United States Patent
Kim et al.

(10) Patent No.: US 12,191,579 B2
(45) Date of Patent: Jan. 7, 2025

(54) ANTENNA STRUCTURE AND METHOD FOR SIGNAL CALIBRATION

(71) Applicant: Samsung Electronics Co., Ltd., Suwon-si (KR)

(72) Inventors: Sungsoo Kim, Suwon-si (KR); Kyuyoung Kim, Suwon-si (KR); Byoungchul Kim, Suwon-si (KR); Seyoon Bae, Suwon-si (KR); Byoungryoul Song, Suwon-si (KR); Kanghyun Ryoo, Suwon-si (KR); Yongyoun Kim, Suwon-si (KR); Sungkoo Park, Suwon-si (KR); Himchan Yun, Suwon-si (KR); Sangha Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 209 days.

(21) Appl. No.: 18/064,047

(22) Filed: Dec. 9, 2022

(65) Prior Publication Data

US 2023/0103819 A1    Apr. 6, 2023

Related U.S. Application Data

(63) Continuation of application No. PCT/KR2021/016071, filed on Nov. 5, 2021.

(30) Foreign Application Priority Data

Nov. 6, 2020  (KR) .................. 10-2020-0148106
Feb. 1, 2021  (KR) .................. 10-2021-0014166

(51) Int. Cl.
*H01Q 5/335*     (2015.01)
*H01Q 3/24*      (2006.01)

(52) U.S. Cl.
CPC ............. *H01Q 5/335* (2015.01); *H01Q 3/247* (2013.01)

(58) Field of Classification Search
None
See application file for complete search history.

(56) References Cited

U.S. PATENT DOCUMENTS 7,979,884 B1   7/2011  Schwartzman et al.
8,055,216 B2   11/2011 Dent
(Continued)

FOREIGN PATENT DOCUMENTS

CN    105577198 A    5/2016
JP    5288668 B2    9/2013
(Continued)

OTHER PUBLICATIONS

International Search Report and Written Opinion of the International Searching Authority dated Feb. 23, 2022, in connection with International Application No. PCT/KR2021/016071, 14 pages.

(Continued)

*Primary Examiner* — Jany Richardson

(57) ABSTRACT

An antenna structure includes a first antenna, a second antenna, at least one processor, a power distribution circuit configured to equally supply power supplied from the processor(s) to the first antenna and the second antenna, and a coupler disposed between the processor(s) and the power distribution circuit, wherein the processor(s) may obtain a first parameter for a first signal received by the first antenna and a second parameter for a second signal received by the second antenna, detect a phase difference between the first signal and the second signal, obtain a matching parameter based on parameters corresponding to a case in which the phase difference satisfies a specified condition among the first parameter and the second parameter, and obtain a third parameter for allowing a reflection coefficient of a signal (Continued)

flowing from the power distribution circuit to the coupler to exist within a specified range among the matching parameters.

20 Claims, 13 Drawing Sheets

(56) References Cited

U.S. PATENT DOCUMENTS

| | | | |
|---|---|---|---|
| 9,184,509 B2* | 11/2015 | Baba | H01Q 1/245 |
| 9,843,375 B2 | 12/2017 | Kim et al. | |
| 10,292,115 B2 | 5/2019 | Yang et al. | |
| 10,560,953 B2 | 2/2020 | Kim et al. | |
| 10,931,323 B2 | 2/2021 | Lee et al. | |
| 11,050,446 B2 | 6/2021 | Lim et al. | |
| 11,228,336 B2 | 1/2022 | Lee | |
| 12,068,766 B2* | 8/2024 | Yoon | H04B 1/04 |
| 2014/0152515 A9 | 6/2014 | Baba et al. | |
| 2016/0126904 A1 | 5/2016 | Kuo et al. | |
| 2017/0257240 A1 | 9/2017 | Ma et al. | |
| 2020/0106497 A1 | 4/2020 | Pehlke | |
| 2020/0177226 A1 | 6/2020 | Cha et al. | |
| 2020/0194904 A1* | 6/2020 | Huh | H01Q 21/065 |
| 2020/0195283 A1 | 6/2020 | Lim et al. | |
| 2020/0235774 A1 | 7/2020 | Lee | |
| 2020/0313280 A1 | 10/2020 | Chang et al. | |
| 2023/0262151 A1* | 8/2023 | Yun | H01Q 21/29 |
| | | | 455/575.3 |
| 2024/0243472 A1* | 7/2024 | Novak | H01Q 15/148 |

FOREIGN PATENT DOCUMENTS

| | | |
|---|---|---|
| KR | 10-2018-0050944 A | 5/2018 |
| KR | 10-2018-0130849 A | 12/2018 |
| KR | 10-2019-0026449 A | 3/2019 |
| KR | 10-2020-0121518 A | 10/2020 |

OTHER PUBLICATIONS

Supplementary European Search Report dated Jan. 9, 2024, in connection with European Patent Application No. 21889637.1, 10 pages.

* cited by examiner

|   First parameter<br>Second parameter | C0 on | C1 on | C2 on | C3 on | sw1 | ... |
|---|---|---|---|---|---|---|
| C0 on | 0° | 12° | 24° | 36° | 10° | |
| C1 on | 8° | 20° | 32° | 44° | 18° | |
| C2 on | 16° | 28° | 40° | 52° | 26° | |
| C3 on | 24° | 36° | 48° | 60° | 34° | |
| sw1 | 15° | 27° | 39° | 51° | 25° | |
| sw2 | 30° | 42° | 54° | 66° | 40° | |
| ⋮ | | | | | | |

701

$\Delta\theta \leq 45°$

FIG.7A

ANTENNA STRUCTURE AND METHOD FOR SIGNAL CALIBRATION

CROSS-REFERENCE TO RELATED APPLICATIONS

This application is a Bypass Continuation of International Application No. PCT/KR2021/016071, filed Nov. 5, 2021, which claims priority to Korean Patent Application No. KR 10-2020-0148106, filed Nov. 6, 2020, and Korean Patent Application No. KR 10-2021-0014166. filed Feb. 1, 2021, the disclosures of which are herein incorporated by reference in their entirety.

BACKGROUND

1. Field

Various embodiments of the disclosure relate to a structure and a method for signal calibration of an antenna structure including multiple antennas.

2. Description of Related Art

In order to satisfy demands for wireless data traffic increasing since commercialization of 4th-generation (4G) communication systems, there have recently been efforts to commercialize next-generation (for example, 5th-generation or pre-5G) communication systems. Furthermore, to this end, electronic devices including multiple antennas for transmitting/receiving various signals have been provided.

In addition, displays having large areas are preferred to effectively provide various functions in line with rapid improvement of the processing performance of electronic devices (for example, smartphones). At the same time, there are still demands for compactness of electronic devices in order to improve portability. In order to satisfy such demands, electronic devices may include foldable electronic devices. Foldable electronic devices can be folded or unfolded around connectors, thereby providing users with portability and availability.

Such a foldable electronic device may have an antenna disposed to perform wireless communication, and may include multiple antennas for supporting wireless communication in respective states according to folding or unfolding operations.

SUMMARY

In order to calibrate signals transmitted or received through multiple antennas, parameters (for example, reflection coefficient, voltage standing wave ratio, return loss) regarding signals transmitted or received through respective antennas need to be measured. If parameters are sensed through a single coupler, however, a tuner for signal calibration may fail to operate normally.

If the tuner function is limited in this manner, the antenna radiation performance may be degraded by the hand-grip effect, universal serial bus (USB) effect, free space loss, and the like.

According to various embodiments of the disclosure, antenna radiation performance may be secured based on a single structure and a single algorithm with regard to multiple antennas.

According to various embodiments of the disclosure, an antenna structure may include a first antenna, a second antenna, at least one processor, a power distribution circuit configured to equally supply power supplied from the at least one processor to the first antenna and the second antenna, and a coupler disposed between the at least one processor and the power distribution circuit, wherein the at least one processor is configured to obtain a first parameter for a first signal received by the first antenna and a second parameter for a second signal received by the second antenna, detect a phase difference between the first signal and the second signal, obtain matching parameters, based on parameters corresponding to cases in which the phase difference satisfies a specified condition among the first parameter and the second parameter, and obtain a third parameter for allowing a reflection coefficient of a signal flowing from the power distribution circuit to the coupler to exist within a specified range among the matching parameters.

According to various embodiments of the disclosure, a correction method for optimizing antenna performance may include obtaining a first parameter for a first signal and a second parameter for a second signal, detecting a phase difference between the first signal and the second signal according to the obtained first parameter and the second parameter, obtaining matching parameters, based on parameters corresponding to cases in which the phase difference satisfies a specified condition among the first parameter and the second parameter, and obtaining a third parameter for allowing reflection coefficients of the first signal and the second signal to exist within a specified range among the matching parameters.

According to various embodiments of the disclosure, an electronic device may include a housing including a first part, a second part coupled to the connecting part so as to be rotatable with respect to the first part, and a connecting part disposed between the first part and the second part, a first antenna including a first portion of the first part, a second antenna including a second portion of the second part, a first point of the first antenna corresponding to a second point of the second antenna when the housing is folded, at least one processor, a power distribution circuit configured to equally supply power supplied from the at least one processor to the first antenna and the second antenna, and a coupler disposed between the at least one processor and the power distribution circuit, and wherein the at least one processor is configured to obtain a first parameter for a first signal received by the first antenna and a second parameter for a second signal received by the second antenna, detect a phase difference between the first signal and the second signal, obtain matching parameters, based on parameters corresponding to cases in which the phase difference satisfies a specified condition among the first parameter and the second parameter, and obtain a third parameter for allowing a reflection coefficient of a signal flowing from the power distribution circuit to the coupler to exist within a specified range among the matching parameters.

According to various embodiments of the disclosure, with regard to multiple antennas disposed on various paths, a single structure and a single algorithm may be used to maintain the phase difference between signals transmitted or received through respective antennas at a predetermined level or lower.

According to various embodiments of the disclosure, a substantially identical parameter may be measured with regard to multiple antennas through a single structure, and signals may be calibrated accordingly, thereby preventing antenna radiation performance degradation.

Before undertaking the Mode for Carrying out the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 7A illustrates a table including a phase difference according to a first parameter and a second parameter, according to an embodiment.

DETAILED DESCRIPTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
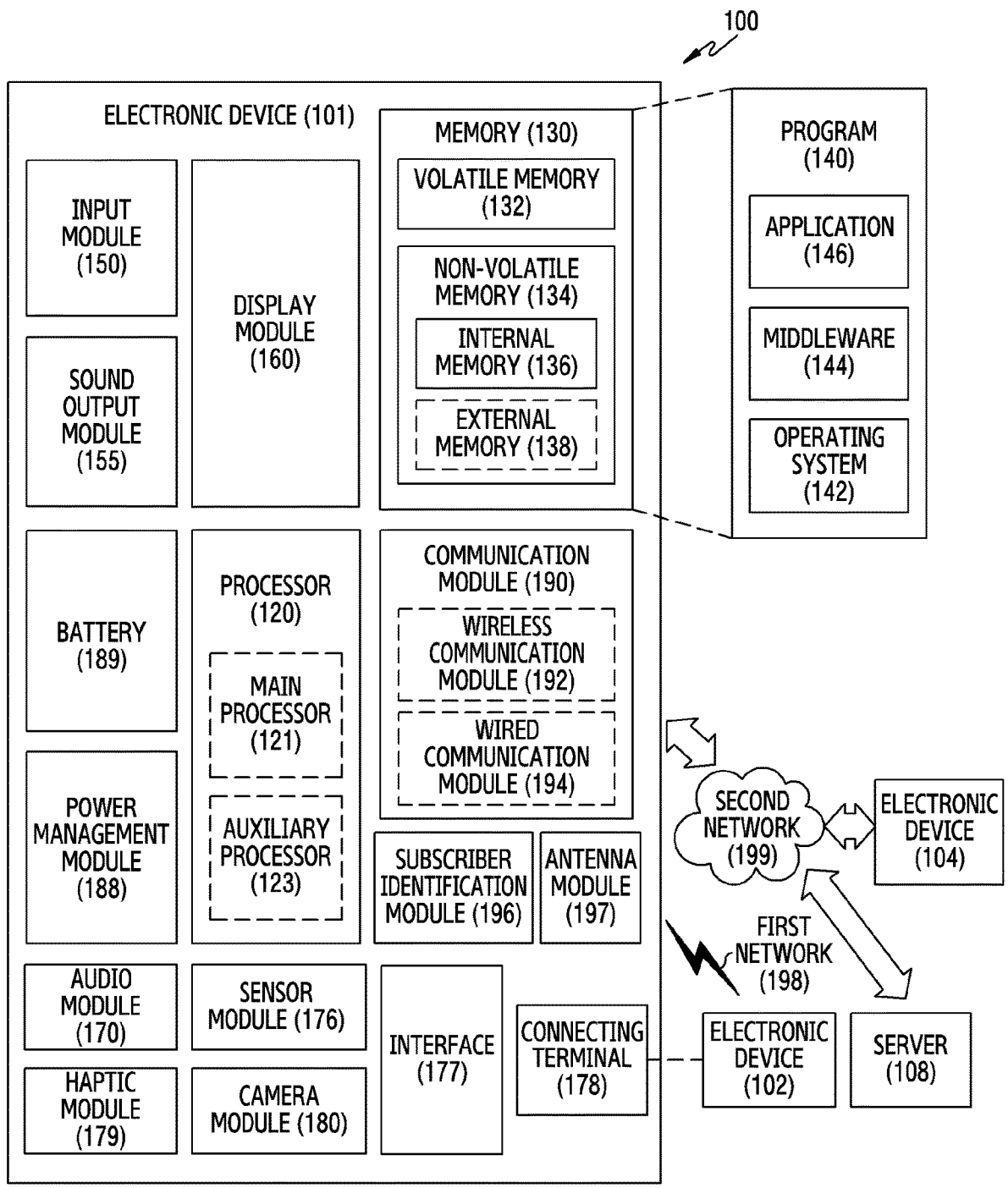
FIG. 1 is a block diagram of an electronic device in a network environment, according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., via wire) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., via wire) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile sub scriber identity (IMSI)) stored in the sub scriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., via wire), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
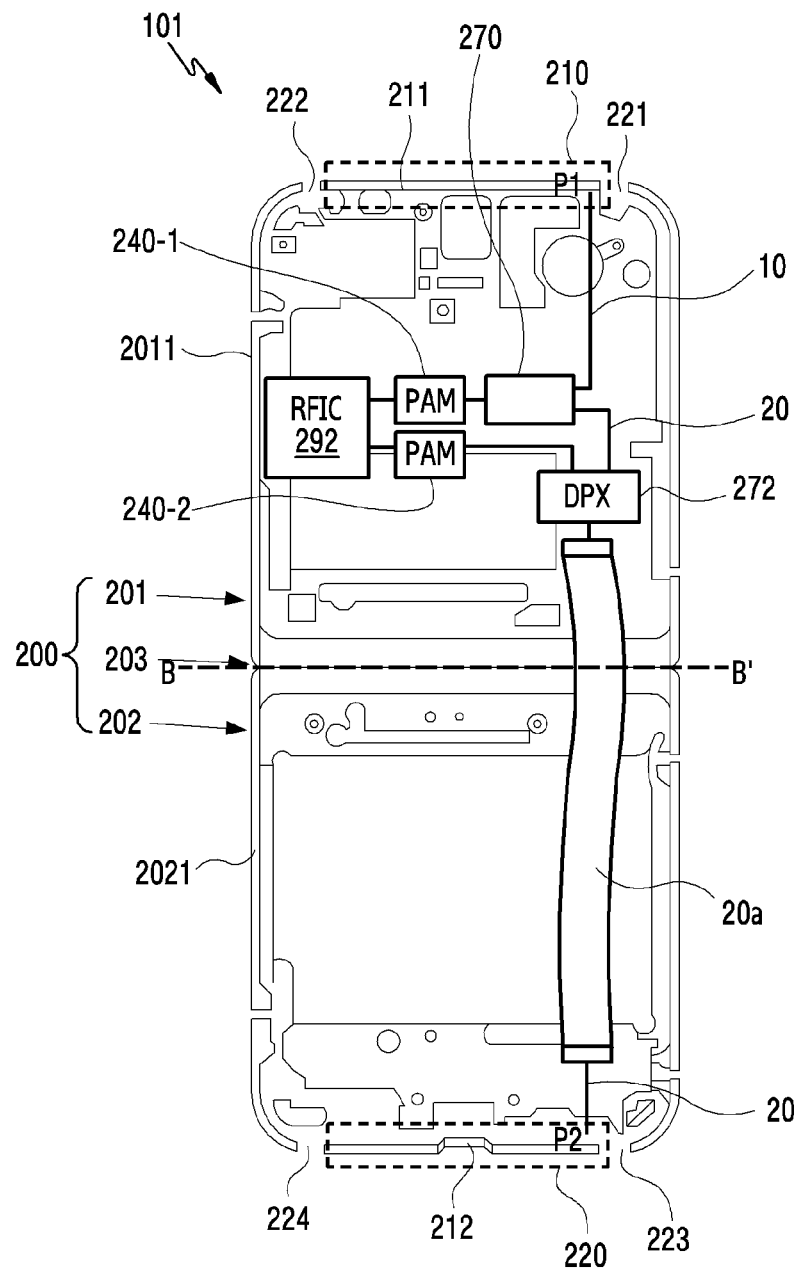
FIG. 2 illustrates an electronic device including a first antenna and a second antenna according to an embodiment.

FIG. 2 illustrates an electronic device including a first antenna and a second antenna according to an embodiment.

Referring to FIG. 2, the electronic device 101 according to an embodiment may include a first antenna 210 and a second antenna 220. The electronic device 101 according to an embodiment may have a substantially rectangular shape in an unfolded state. According to an embodiment, the electronic device 101 may be folded or unfolded about a folding axis B-B' or a connector 203 substantially parallel to the short edge of the rectangle.

According to an embodiment, a first portion 211 of a first side member 2011 may embody a portion of one edge of the first side member 2011. For example, the first portion 211 may be positioned at an edge farthest from the connector 203 among edges of the first side member 2011. In an embodiment, the first portion 211 may be disposed substantially parallel to the connector 203.

In an embodiment, the first portion 211 may be fed from a radio frequency integrated circuit (RFIC) 292 at the first point P1 through the first path 10 and may operate as the first antenna 210 for transmitting and/or receiving RF signals of a designated band. In an embodiment, the first portion 211 may include a conductive material.

In an embodiment, a first segmented portion 221 may be configured at one end of the first portion 211, and a second segmented portion 222 may be configured at the other end of the first portion 211. The first segmented portion 221 and the second segmented portion 222 may separate the first portion 211 from other portions of the first side member 2011. In an embodiment, the first segmented portion 221 and/or the second segmented portion 222 may include a material having a specified dielectric constant or a non-conductive material (e.g., air or resin).

According to an embodiment, a second portion 212 of a second side member 2021 may configure a portion of one edge of the second side member 2021. For example, the second portion 212 may be positioned at an edge farthest from the connector 203 among edges of the second side member 2021.

In an embodiment, the second portion 212 may be fed from the radio frequency integrated circuit (RFIC) 292 at the second point P2 through the second path 20 and may operate as the second antenna 220 for transmitting and/or receiving RF signals of a designated band. In an embodiment, the second portion 212 may include a conductive material. The second path 20 may include a flexible printed circuit board RF cable (FRC) 20a crossing the connector 203. In an embodiment, the FRC 20a may be configured as a separate flexible printed circuit board (F-PCB) and disposed between the PCBs.

In an embodiment, a third segmented portion 223 may be configured at one end of the second portion 212, and a fourth segmented portion 224 may be configured at the other end of the second portion 212. The third segmented portion 223 and the fourth segmented portion 224 may separate the second portion 212 from other portions of the second side member 202l. In an embodiment, the third segmented portion 223 and/or the fourth segmented portion 224 may include a material having a specified dielectric constant or a non-conductive material (e.g., air or resin).

The electronic device 101 according to an embodiment may include power amplifier modules (PAMs) 240-1 and 240-2 and a duplexer 272. In an embodiment, the first PAM 240-1 may be disposed in an electrical path between a power distribution circuit 270 and the RFIC 292. In an embodiment, the second PAM 240-2 may be disposed in an electrical path between the duplexer 272 and the RFIC 292. In an embodiment, the PAMs 240-1 and 240-2 may amplify a signal provided from the RFIC 292. In an embodiment, the duplexer 272 may include a filter circuit for selectively passing a signal provided from the first PAM 240-1 or a signal provided from the second PAM 240-2.

In an embodiment, the first portion 211 and the second portion 212 may correspond to each other. For example, the first portion 211 and the second portion 212 may be respectively disposed at edges facing each other among edges of the electronic device 101 in an unfolded state. For another example, when viewed from above the rear surface of the first part 201, the first portion 211 and the second portion 212 may overlap each other with the electronic device 101 in a folded state.

In an embodiment, the first point P1 of the first portion 211 and the second point P2 of the second portion 212 may correspond to each other. For example, when viewed from above the rear surface of the first part 201 in a folded state of the electronic device 101, the first point P1 of the first portion 211 may overlap the second point P2 of the second portion 212.

In an embodiment, the power distribution circuit 270 may equally provide power supplied from the RFIC 292 to the first portion 211 and the second portion 212. According to an embodiment, the power distribution circuit 270 may provide power to the first portion 211 through the first path 10 and provide power to the second portion 212 through the second path 20.

According to an embodiment, the electronic device 101 may adjust the first signal provided to the first portion 211 and the second signal provided to the second portion 212 to have the same phase when the electronic device 101 is folded around the folding axis B. A detailed description thereof will be given later.

Figure 3:
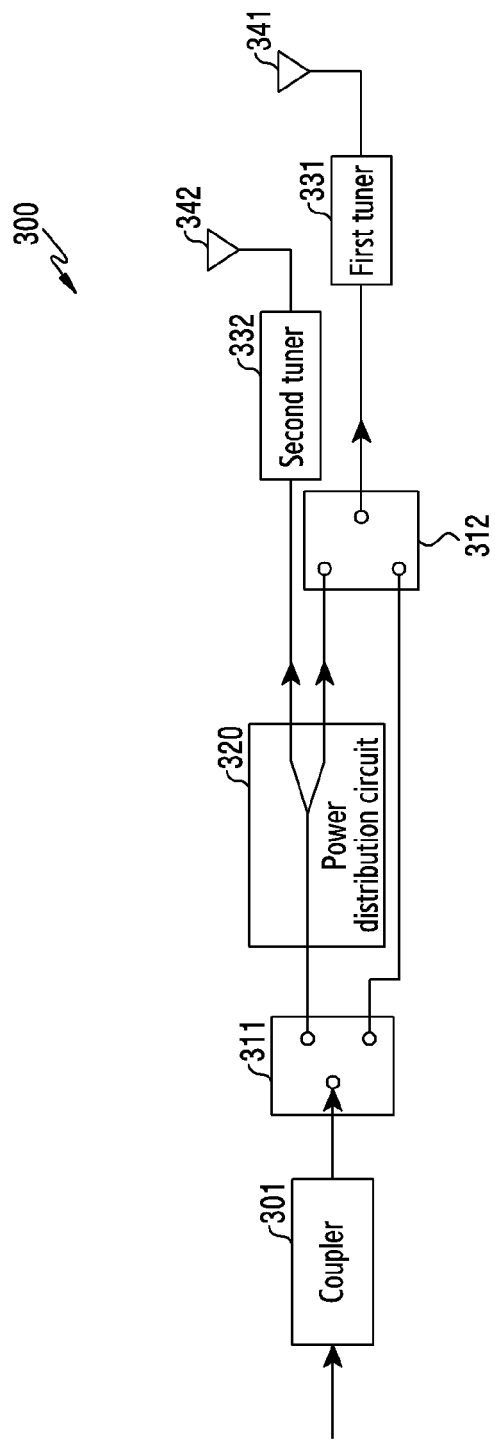
FIG. 3 illustrates an antenna structure according to an embodiment.

FIG. 3 illustrates an antenna structure according to an embodiment.

Referring to FIG. 3, the antenna structure 300 according to an embodiment may include a coupler 301, a first switch 311, a second switch 312, a power distribution circuit 320 (e.g., the power distribution circuit 270 of FIG. 2), a first tuner 331, a second tuner 332, a first antenna 341, and a second antenna 342. According to another embodiment (not illustrated), some of the above-described components (e.g., the second tuner 332) may be omitted and other components may be added.

According to an embodiment, the coupler 301, the first switch 311, the second switch 312, the power distribution circuit 320, the first tuner 331, and the second tuner 332 may be disposed on a printed circuit board (PCB).

According to an embodiment, the first switch 311 may be connected to the coupler 301, the power distribution circuit 320, and the second switch 312. According to an embodiment, the first switch 311 may be set such that the coupler 301 is selectively connected to the power distribution circuit 320 or the second switch 312. The first switch 311 is configured to selectively connect the coupler 301 to the power distribution circuit 320 or the second switch 312. For example, the first switch 311 may include a single pole double throw (SPDT) switch, but is not limited thereto.

According to an embodiment, the second switch 312 may be connected to the first switch 311, the first tuner 331, and the power distribution circuit 320. According to an embodiment, the second switch 312 may be set such that the first antenna 341 is selectively connected to the first switch 311 or the power distribution circuit 320. The second switch 312 is configured to selectively connect the first antenna 341 to the power distribution circuit 320 or the first switch 311. For example, the second switch 312 may include a double pole single throw (DPST) switch, but is not limited thereto.

According to an embodiment, the coupler 301 may be electrically connected to the power distribution circuit 320 and the second switch 312 through the first switch 311. The coupler 301 may be electrically connected to at least one processor (e.g., a processor 120 of FIG. 1) or a communication module (e.g., a communication module 190 of FIG. 1). According to an embodiment, the coupler 301 may provide a transmission signal received from at least one processor to the power distribution circuit 320 or the second switch 312.

According to an embodiment, the coupler 301 may detect parameters for the first antenna 341 and the second antenna 342. For example, the coupler 301 may detect a reflection coefficient of a signal input from the power distribution circuit 320. A detailed description thereof will be provided later.

According to an embodiment, the power distribution circuit 320 may equally distribute power of a signal provided through at least one processor to the first antenna 341 and the second antenna 342. According to an embodiment, the power distribution circuit 320 may branch the signal provided through the first switch 311 into two signals having output power ½ times the input power of the provided signal. The power distribution circuit 320 may provide the branched signal to the second switch 312 and the second tuner 332 or the second antenna 342.

According to an embodiment, the first antenna 341 and the second antenna 342 may include an antenna radiator for transmitting and receiving the first signal and the second signal, respectively.

According to an embodiment, the antenna structure 300 may include the first tuner 331 disposed between the first antenna 341 and the power distribution circuit 320. According to an embodiment, the antenna structure 300 may include the second tuner 332 disposed between the second antenna 342 and the power distribution circuit 320.

According to an embodiment, the first tuner 331 may include an inductor having a specified inductance value, a capacitor having a specified capacitance value, and/or a variable capacitor. According to an embodiment, the first tuner 331 may include a lumped element (e.g., an RLC element) for tuning the first antenna 341 (e.g., impedance matching and/or resonant frequency adjustment). According to an embodiment, the second tuner 332 may include an inductor having a specified inductance value, a capacitor having a specified capacitance value, and/or a variable capacitor. According to an embodiment, the second tuner 332 may include a lumped element (e.g., an RLC element) for tuning the second antenna 342.

According to an embodiment, at least one processor may control the phases of the first signal transmitted to the first antenna 341 and the second signal transmitted to the second antenna 342 through the first tuner 331 and/or the second tuner 332. At least one processor according to an embodiment may control the first signal and the second signal to have a phase difference within a specified range through the first tuner 331 and/or the second tuner 332. For example, the first signal and the second signal may be controlled to have a phase difference of substantially −45° to substantially +45°. For another example, at least one processor may control the first signal and the second signal to be in-phase through the first tuner 331 and/or the second tuner 332.

Referring to FIGS. 2 and 3, when the electronic device 101 according to an embodiment is in an unfolded state, the antenna structure 300 may operate in a closed loop structure. For example, at least one processor may control the first signal and/or the second signal through the first tuner 331 and/or the second tuner 332 based on the feedback signal received from the first antenna 341 or the second antenna 342.

According to an embodiment, when the electronic device 101 is in a folded state with respect to the folding axis B-B', the antenna structure 300 may operate in an open loop structure. For example, at least one processor may control the first signal and/or the second signal through the first tuner 331 and/or the second tuner 332 based on a pre-stored instruction. For example, at least one processor may control the first signal and/or the second signal through the first tuner 331 and/or the second tuner 332 based on a code according to the combination of carrier aggregation (CA).

Figure 4A:
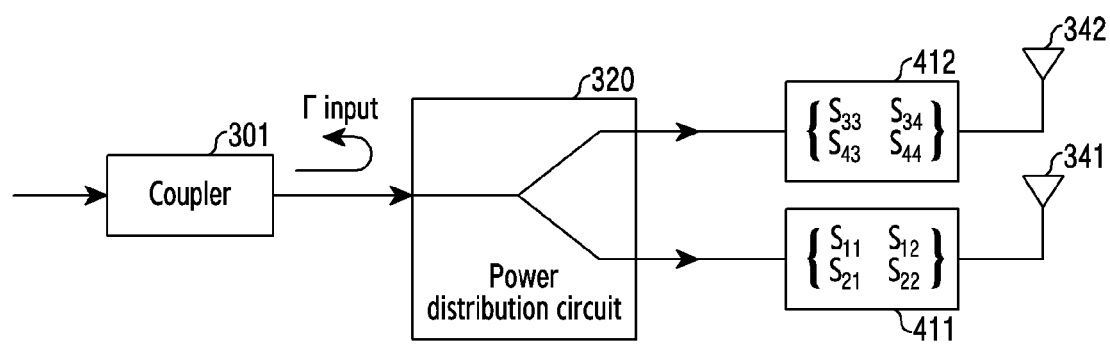
FIG. 4A illustrates an antenna structure including a first parameter and a second parameter according to an embodiment.
Figure 4B:
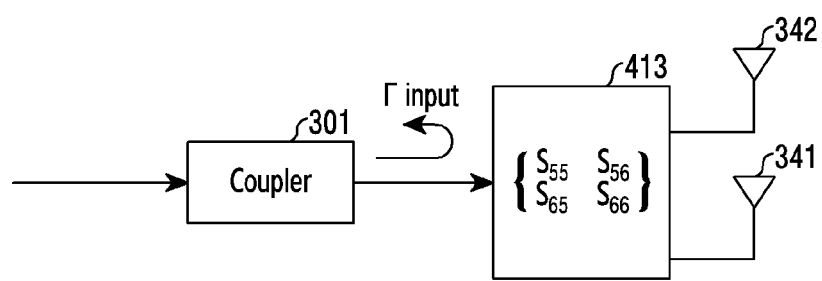
FIG. 4B illustrates an antenna structure including a third parameter according to an embodiment.
Figure 4C:
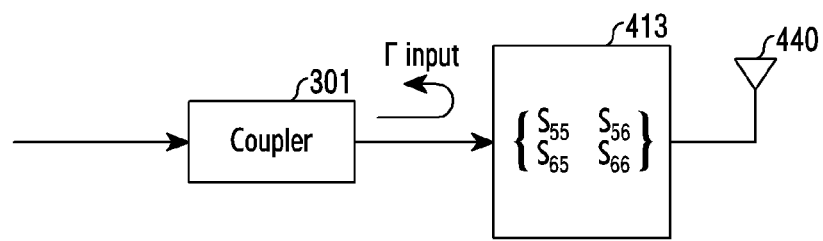
FIG. 4C illustrates an antenna structure including a third parameter and a third antenna according to an embodiment.

FIG. 4A illustrates an antenna structure including a first parameter and a second parameter according to an embodiment. FIG. 4B illustrates an antenna structure including a third parameter according to an embodiment. FIG. 4C illustrates an antenna structure including a third parameter and a third antenna according to an embodiment.

Referring to FIG. 4A, at least one processor (e.g., the processor 120 of FIG. 1) according to an embodiment may obtain a first parameter 411 for the first signal transmitted or received by the first antenna 341 and a second parameter 412 for the second signal transmitted or received by the second antenna 342. The first parameter 411 and the second parameter 412 may be referred to as a first matching network and a second matching network, respectively.

According to an embodiment, the first parameter 411 and the second parameter 412 may include s parameters (e.g., $S_{11}$, $S_{34}$). According to an embodiment, the first parameter 411 and the second parameter 412 may include at least one of a reflection coefficient, a return loss, and a voltage standing wave ratio (VSWR). For example, the first parameter 411 may include a first reflection coefficient for the first antenna 341, and the second parameter 412 may include a second reflection coefficient for the second antenna 342. According to another embodiment, the first parameter 411 and the second parameter 412 may include a state of the first tuner 331 (e.g., switch 1 on) and a state of the second tuner 332, respectively, but are not limited thereto.

Referring to FIGS. 4A to 4C, at least one processor may obtain a third parameter 413 based on the first parameter 411 and the second parameter 412. According to an embodiment, at least one processor may obtain the third parameter 413 from the sum of respective admittances for the first parameter 411 and the second parameter 412. A detailed description thereof will be given later.

According to an embodiment, the third parameter 413 may be applied substantially equally to the first antenna 341 and the second antenna 342. For example, at least one processor may control the first signal transmitted or received through the first antenna 341 and the second signal transmitted or received through the second antenna 342 by controlling the third parameter 413.

According to an embodiment, at least one processor may implement a third antenna 440 substantially equivalent to the first antenna 341 and the second antenna 342 by controlling the phase difference between the first signal and the second signal within a specified range (e.g., substantially −45° to substantially +45°). According to an embodiment, the third parameter 413 may be applied to the third antenna 440 substantially equivalent to the first antenna 341 and the second antenna 342. For example, at least one processor may adjust the third parameter 413 to control a third signal transmitted or received through the third antenna 440. The first antenna 341 and the second antenna 342 may operate with optimum efficiency by adjusting (performed by the at least one processor) the third parameter 413. The optimum efficiency may refer to the fact that a reflection coefficient of a signal flowing into the coupler 301 is minimized.

According to an embodiment, at least one processor may detect parameters for the first antenna 341 and the second antenna 342 through the coupler 301. According to an embodiment, at least one processor may detect a reflection coefficient for the first antenna 341 and the second antenna 342 flowing into the coupler 301 from the power distribution circuit 320. According to an embodiment, at least one processor may detect substantially the same reflection coefficient ($\Gamma_{input}$) with respect to the first antenna 341 and the second antenna 342 from the third parameter 413. According to an embodiment, at least one processor may detect, from the third parameter 413, a reflection coefficient ($\Gamma_{input}$) for the third antenna 440 that is substantially equivalent to the first antenna 341 and the second antenna 342. According to an embodiment, at least one processor may control the third parameter 413 to minimize the reflection coefficient ($\Gamma_{input}$) for the third antenna 440. A detailed description thereof will be given later.

Figure 5:
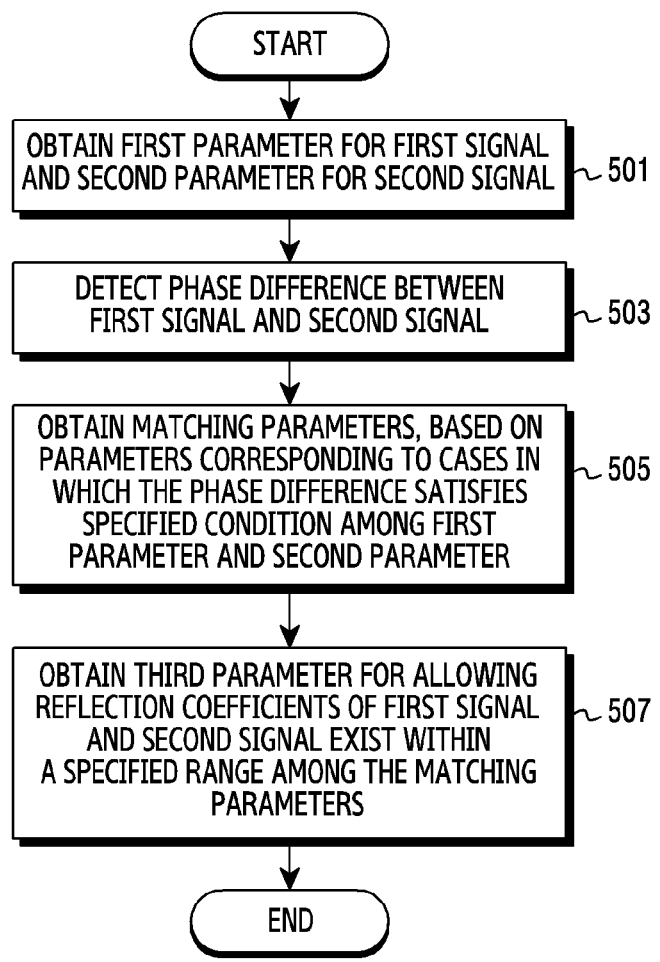
FIG. 5 is a flowchart of obtaining a third parameter, based on a first parameter and a second parameter according to an embodiment.

FIG. 5 is a flowchart of obtaining a third parameter based on the first parameter and the second parameter according to an embodiment.

Referring to FIG. 5, at least one processor (e.g., the processor 120 of FIG. 1) according to an embodiment may obtain a first parameter (e.g., the first parameter 411 of FIG. 4A) and a second parameter (e.g., the second parameter 412 of FIG. 4A), and may obtain a matching parameter and a third parameter based thereon. The overlapping description of the same or substantially the same components as the above-described components will be omitted.

According to an embodiment, at least one processor may obtain the first parameter and the second parameter in operation 501. At least one processor according to an embodiment may obtain the first parameter for the first signal transmitted or received through the first antenna (e.g., the first antenna 341 of FIG. 4A) and the second parameter for the second signal transmitted or received through the second antenna (e.g., the second antenna 342 of FIG. 4A).

According to an embodiment, at least one processor may detect a phase difference between the first signal and the second signal in operation 503. According to an embodiment, at least one processor may detect a phase of the first signal transmitted or received through the first antenna and the second signal transmitted or received through the second antenna, and may detect a phase difference between the first signal and the second signal based thereon. According to another embodiment, at least one processor may obtain a table including the detected phase difference, but a detailed description thereof will be provided later.

According to an embodiment, in operation 505, at least one processor may obtain a matching parameter based on the first parameter, the second parameter, and the detected phase difference. According to an embodiment, when the phase difference between the first signal and the second signal among the first parameter and the second parameter satisfies a specified condition, at least one processor may obtain parameters corresponding to the matching parameters. According to an embodiment, when the phase difference between the first signal and the second signal among the first parameter and the second parameter is equal to or less than a reference value, at least one processor may obtain parameters corresponding to the matching parameters. For example, when the phase difference between the first signal and the second signal among the first parameter and the second parameter is substantially 45° or less, corresponding parameters may be obtained as matching parameters. The operation of obtaining the matching parameter through the above-described operation 505 may be referred to for calibration for the first parameter and the second parameter.

According to an embodiment, at least one processor, in operation 507, may obtain the third parameter such that reflection coefficients ($\Gamma_{input}$) of the first signal and the second signal among the matching parameters are within a specified range. According to an embodiment, at least one processor may obtain, as the third parameter, parameters corresponding to the case where the reflection coefficient ($\Gamma_{input}$) sensed through the coupler (e.g., the coupler 301 of FIG. 3) is equal to or less than a reference value. For example, from among the matching parameters, at least one processor may obtain, as the third parameter, parameters such that the reflection coefficient ($\Gamma_{input}$) detected through the coupler is minimized. The operation of the at least one processor obtaining the third parameter in operation 507 may be referred to as correction of the matching parameter obtained in operation 505.

According to an embodiment, at least one processor may obtain a chart (e.g., smith chart) or a look-up table (LUT) including the relationship between the third antenna (e.g., the third antenna 440 of FIG. 4C) and the third parameter through operations 501 to 507.

Figure 6:
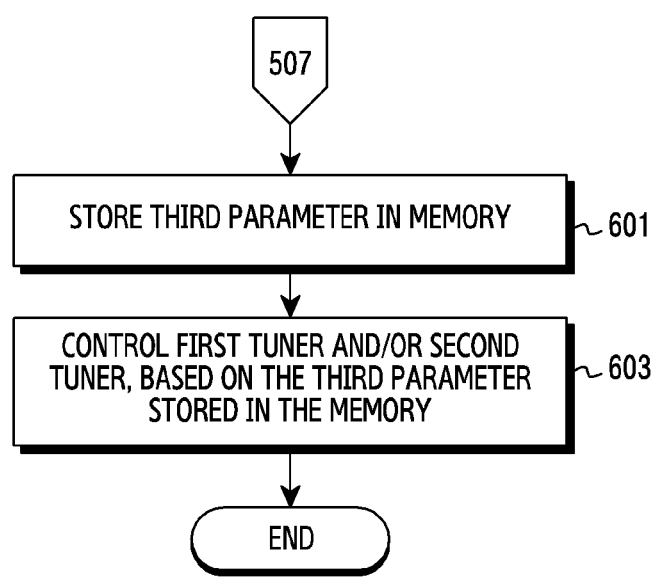
FIG. 6 is a flowchart of controlling a tuner, based on a stored third parameter according to an embodiment.

FIG. 6 is a flowchart of controlling a tuner based on a stored third parameter according to an embodiment.

Referring to FIG. 6, the electronic device (e.g., the electronic device 101 of FIG. 1) according to an embodiment may include a memory (e.g., the memory 130 of FIG. 1) electrically connected to at least one processor (e.g., the processor 120 of FIG. 1).

According to an embodiment, at least one processor, in operation 601, may store the third parameter (e.g., the third parameter 413 of FIG. 4B) obtained in operation 507 in the memory. According to another embodiment (not illustrated), at least one processor may store information (e.g., look up table (LUT)) including the relationship between the third antenna (e.g., the third antenna 440 of FIG. 4C) and the third parameter in the memory.

According to an embodiment, at least one processor, in operation 603, may control the first tuner (e.g., the first tuner 331 of FIG. 3) and/or the second tuner (e.g., the second tuner 332 of FIG. 3) based on the stored third parameter. According to an embodiment, at least one processor, in operation 603, may control the first signal (e.g., transmitted or received through the first antenna 341) and/or the second signal (e.g., transmitted or received through the second antenna 342) by controlling the first tuner and/or the second tuner based on the stored third parameter. According to an embodiment, at least one processor, in operation 603, may control the phase of the first signal and/or the second signal based on the stored third parameter. For example, at least one processor may control the first tuner and/or the second tuner so that a phase difference between the first signal and the second signal is 45° or less based on the stored third parameter.

According to another embodiment, at least one processor may control the first signal and/or the second signal by controlling the first tuner and/or the second tuner based on the look-up table stored in the memory.

Figure 7B:
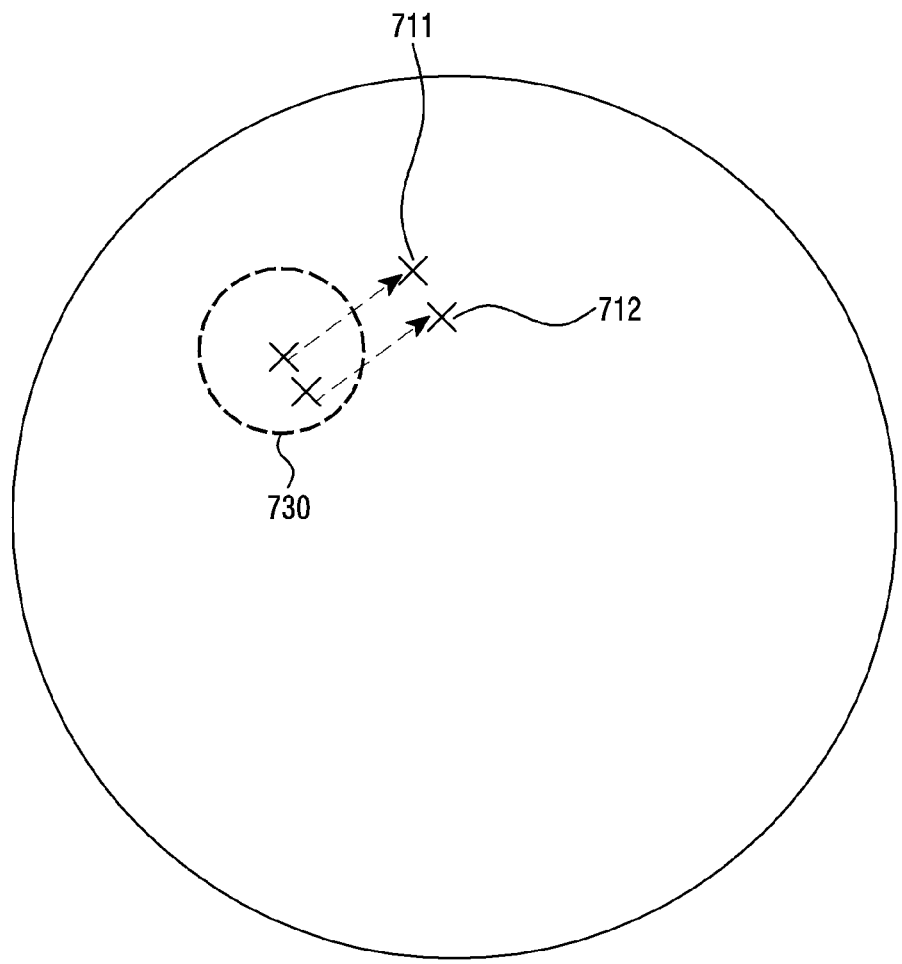
FIG. 7B illustrates a phase difference and a reference value according to a first parameter and a second parameter obtained according to an embodiment.

FIG. 7A illustrates a table including a phase difference according to the first parameter and the second parameter, according to an embodiment. FIG. 7B illustrates a phase difference and a reference value according to the first parameter and the second parameter obtained according to an embodiment.

Referring to FIGS. 7A and 7B, at least one processor (e.g., the processor 120 of FIG. 1) according to an embodiment may obtain parameters corresponding to a case in which a phase difference between the first signal and the second signal satisfies a specified criterion. Description of the same or substantially the same components as the above-described components will be omitted.

Referring to FIG. 7A, at least one processor according to an embodiment may obtain a phase difference between the first signal and the second signal according to the first parameter and the second parameter. For example, at least one processor may obtain the table 701 including the phase difference between the first signal and the second signal according to the first parameter and the second parameter. According to an embodiment, a parameter (e.g., the matching parameter of FIG. 5) may be obtained when the phase difference between the first signal and the second signal in the table 701 satisfies a specified condition. For example, parameters corresponding to a case in which the phase difference is substantially 45° or less in the table 701 including the phase difference may be obtained as matching parameters.

Referring to FIG. 7B, at least one processor according to an embodiment may set a threshold for a phase difference between the first signal and the second signal. According to an embodiment, the electronic device (e.g., the electronic device 101 of FIG. 1) may include a pre-stored reference value for the phase difference between the first signal and the second signal. According to an embodiment, at least one processor may obtain a matching parameter 730 by excluding the first parameter 711 and the second parameter 712 corresponding to the case where the phase difference between the first signal and the second signal exceeds a set or pre-stored reference value. For example, parameters corresponding to the case where the phase difference is less than or equal to substantially 45° may be obtained as matching parameters, except for parameters corresponding to the case where the phase difference between the first signal and the second signal is greater than substantially 45°. A method by which at least one processor obtains the matching parameter and/or the third parameter is not limited to the above-described example and may be obtained through various methods.

Figure 8A:
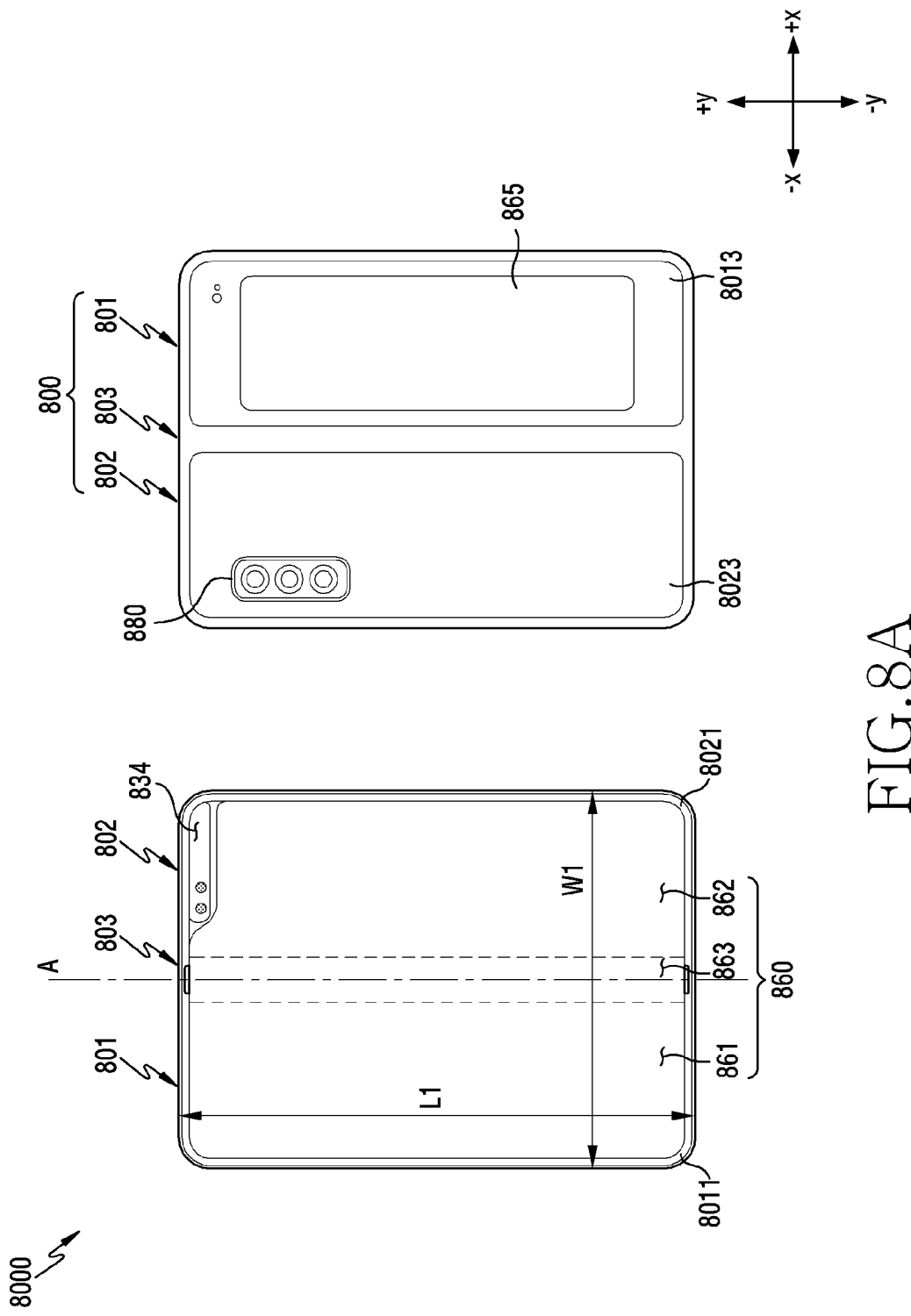
FIG. 8A illustrates an electronic device in an unfolded state, according to an embodiment.
Figure 8B:
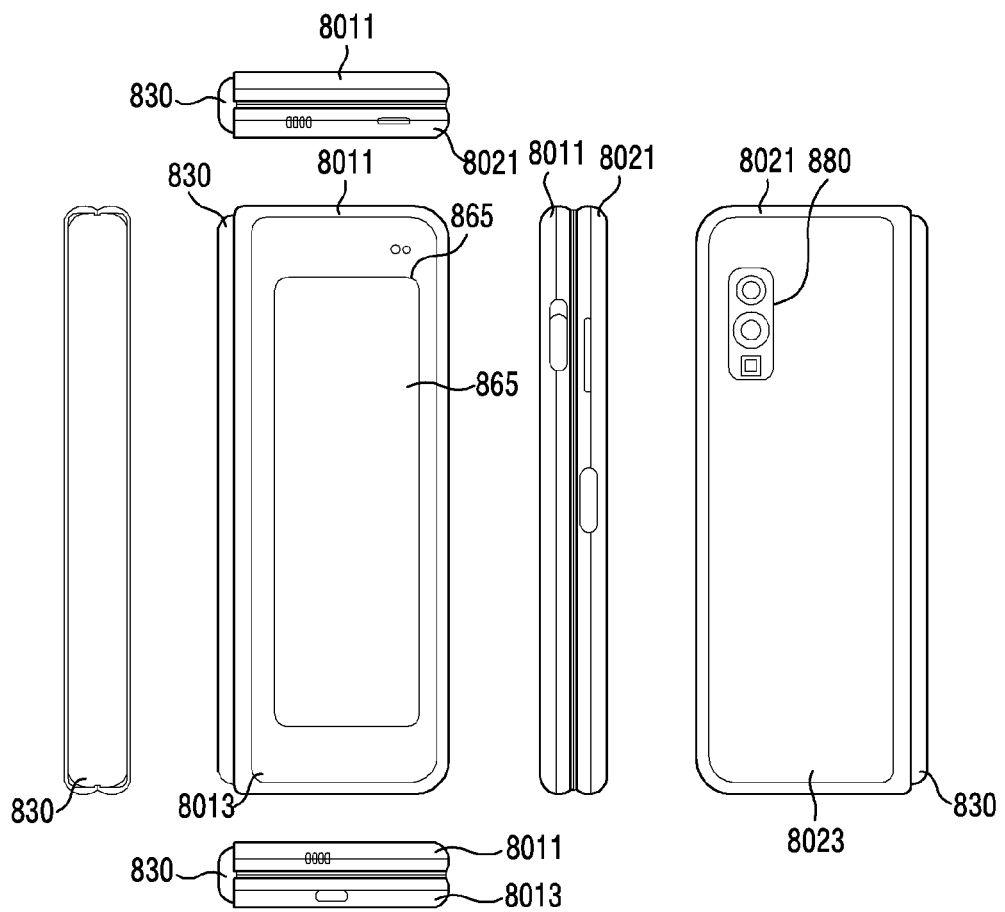
FIG. 8B illustrates an electronic device in a folded state, according to an embodiment.

FIG. 8A illustrates an electronic device in an unfolded state, according to an embodiment. FIG. 8B illustrates an electronic device in a folded state, according to an embodiment.

Referring to FIGS. 8A and 8B, in an embodiment, an electronic device 8000 (e.g., the electronic device 101 of FIG. 1) may include a foldable housing 800 (hereinafter, abbreviated "housing" 800) and a flexible or foldable display 860 (hereinafter, abbreviated "display" 860) disposed in a space configured by the housing 800. In the disclosure, the surface on which the display 860 is disposed is defined as the first surface or the front surface of the electronic device 8000. In addition, the opposite surface of the front surface is defined as the second surface or the rear surface of the electronic device 8000. Also, a surface surrounding the space between the front surface and the rear surface is defined as a third surface or a side surface of the electronic device 8000.

In an embodiment, the housing 800 may have a substantially rectangular shape in an unfolded state of FIG. 8A. For example, the housing 800 may have a specified width W1 and a specified length L1 longer than the specified width W1. As another example, the housing 800 may have a specified width W1 and a specified length L1 that is substantially equal to or shorter than the specified width W1. For example, the specified width W1 may be the width of the display 860. In an embodiment, the housing 800 of the electronic device 8000 may be folded or unfolded based on a folding axis A that is substantially parallel to the long edge (e.g., an edge in the y-axis direction among edges of the housing 800 of the electronic device 8000 in FIG. 8A) of the rectangle.

In an embodiment, the housing 800 may include a first part 801, a second part 802, and a connector 803. The connector 803 may be disposed between the first part 801 and the second part 802. The connector 803 may be coupled to the first part 801 and the second part 802, and the first part 801 and/or the second part 802 may be rotated about the connector 803 (or folding axis A).

In an embodiment, the first part 801 may include a first side member 8011 and a first rear cover 8013. In an embodiment, the second part 802 may include a second side member 8021 and a second rear cover 8023.

In an embodiment, the first side member 8011 may extend along an edge of the first part 801, and may configure at least a portion of a side surface of the electronic device 8000. The first side member 8011 may include at least one conductive portion formed of a conductive material (e.g., metal). The conductive portion may act as an antenna radiator for transmitting and/or receiving RF signals. Similar to the first side member 8011, the second side member 8021 may configure a portion of a side surface of the electronic device 8000, and at least a portion of the second side member 8021 may be formed of a conductive material to operate as an antenna radiator.

In an embodiment, the first side member 8011 and the second side member 8021 may be disposed on both sides about the folding axis A, and may have a substantially symmetrical shape with respect to the folding axis A.

In an embodiment, the angle or distance between the first side member 8011 and the second side member 8021 may vary depending on whether the electronic device 8000 is in an unfolded state, a folded state, or an intermediate state.

In an embodiment, the housing 800 may define a recess to receive the display 860. The recess may correspond to the shape of the display 860.

In an embodiment, a sensor area 834 may be configured to have a predetermined area adjacent to one corner of the second part 802. However, the arrangement, shape, and size of the sensor area 834 are not limited to the illustrated example. For example, in another embodiments, the sensor area 834 may be provided at another corner of the housing 800 or any area between the top and bottom corners. As another example, the sensor area 834 may be omitted. For example, components disposed in the sensor area 834 may be disposed under the display 860, or may be disposed at other locations in the housing 800. In an embodiment, components for performing various functions embedded in the electronic device 8000 may be exposed on the front surface of the electronic device 8000 through the sensor area 834 or through one or more openings provided in the sensor area 834. In various embodiments, the components may include various types of sensors. The sensor may include, for example, at least one of a front camera, a receiver, and a proximity sensor.

In an embodiment, a first rear cover 8013 may be disposed on the first part 801 on the rear surface of the electronic device 8000. The first rear cover 8013 may have a substantially rectangular edge. Similar to the first rear cover 8013, a second rear cover 8023 may be disposed on the second part 802 on the rear surface of the electronic device 8000.

In an embodiment, the first rear cover 8013 and the second rear cover 8023 may have a substantially symmetrical shape with respect to the folding axis A. However, the first rear cover 8013 and the second rear cover 8023 do not necessarily have symmetrical shapes, and in another embodiment, the electronic device 8000 may include a first rear cover 8013 and/or a second rear cover 8023 having various shapes. In another embodiment, the first rear cover 8013 may be integrally configured with the first side member 8011, and the second rear cover 8023 may be integrally configured with the second side member 8021.

In an embodiment, the first rear cover 8013, the second rear cover 8023, the first side member 8011, and the second side member 8021 may configure a space in which various components (e.g., a printed circuit board or a battery) of the electronic device 8000 may be disposed.

In an embodiment, one or more components may be disposed or visually exposed on the rear surface of the electronic device 8000. For example, at least a portion of the sub-display 865 may be visually exposed through at least one area of the first rear cover 8013. As another example, a rear camera 880 may be visually exposed through at least one area of the second rear cover 8023. As another example, the rear camera 880 may be disposed in an area on the rear side of the electronic device 8000.

The housing 800 of the electronic device 8000 is not limited to the shape and combination illustrated in FIGS. 8A and 8B, and may be implemented by a combination of other shapes or parts.

Referring to FIG. 8B, the connector 803 may be implemented such that the first part 801 and the second part 802 are mutually rotatable. For example, the connector 803 may include a hinge structure coupled to the first part 801 and the second part 802. In an embodiment, the connector 803 may include a hinge cover 830 disposed between the first side member 8011 and the second side member 8021 to cover an internal component (e.g., the hinge structure). In an embodiment, the hinge cover 830 may be covered by a portion of the first side member 8011 and the second side member 8021 or exposed to the outside according to the state (flat state or folded state) of the electronic device 8000.

For example, as illustrated in FIG. 8A, when the electronic device 8000 is in an unfolded state, the hinge cover 830 may not be exposed because it is covered by the first side member 8011 and the second side member 8021. For example, as illustrated in FIG. 8B, when the electronic device 8000 is in a folded state, the hinge cover 830 may be exposed between the first side member 8011 and the second side member 8021 to the outside. For example, when the first side member 8011 and the second side member 8021 are in an intermediate state that is folded with a certain angle, a portion of the hinge cover 830 may be partially exposed to the outside between the first side member 8011 and the second side member 8021. However, in this case, the exposed area of the hinge cover 830 may be smaller than the fully folded state of FIG. 8B.

In an embodiment, the display 860 may be disposed on a space formed by the housing 800. For example, the display 860 is seated on a recess formed by the housing 800, and may configure most of the front surface of the electronic device 8000. For example, the front surface of the electronic device 8000 may include a display 860 and a partial area of the first side member 8011 and a partial area of the second side member 8021 adjacent to the display 860. As another example, the rear surface of the electronic device 8000 may include a first rear cover 8013, a portion of the first side member 9011 adjacent to the first rear cover 8013, a second rear cover 8023, and a portion of the second side member 8021 adjacent to the second rear cover 8023.

In an embodiment, the display 860 may include a flexible display in which at least a partial area can be deformed into a flat surface or a curved surface. In an embodiment, the display 860 may include a folding area 863, a first area 861, and a second area 862. The folding area 863 may extend along the folding axis A, and the first area 861 may be disposed on one side (left side of folding area 863 illustrated in FIG. 8A) of the folding area 863, and a second area 862 may be disposed on the other side (right side of folding area 863 illustrates in FIG. 8A) of the folding area 863. As another example, the first area 861 may be an area disposed on the first part 801, and the second area 862 may be an area disposed on the second part 802. The folding area 863 may be an area disposed on the connector 803.

The division of regions of the display 860 illustrated in FIG. 8A is exemplary, and the display 860 may be divided into a plurality (e.g., four or more or two) regions according to a structure or function. For example, in the embodiment illustrated in FIG. 8A, the regions of the display 860 may be divided by the folding region 863 or the folding axis A, but in another embodiment, the display 860 may be divided into regions based on other folding regions.

In an embodiment, the first area 861 and the second area 862 may have a symmetrical shape with respect to the folding area 863. However, unlike the first area 861, the second area 862 may include a notch cut according to the presence of the sensor area 834, but may have a symmetrical shape to the first area 861 in other areas. For example, the first area 861 and the second area 862 may include a portion having a shape symmetric to each other and a portion having a shape asymmetric to each other.

Hereinafter, operations of the first side member 8011 and the second side member 8021 according to states of the electronic device 8000 (e.g., an unfolded state and a folded state) and respective regions of the display 860 will be described.

In an embodiment, when the electronic device 8000 is in an unfolded state (e.g., FIG. 8A), the first side member 8011 and the second side member 8021 may be disposed to face the same direction while forming an angle of substantially 180 degrees. The surface of the first area 861 and the surface of the second area 862 of the display 860 may configure substantially 180 degrees with each other and may face substantially the same direction (e.g., the front direction of the electronic device). The folding area 863 may configure the same plane as the first area 861 and the second area 862.

In an embodiment, when the electronic device 8000 is in a folded state (e.g., FIG. 8B), the first side member 8011 and the second side member 8021 may be disposed to face each other. The surface of the first area 861 and the surface of the second area 862 of the display 860 may face each other while configuring a narrow angle (e.g., between 0 and 10 degrees). At least a portion of the folding area 863 may be configured of a curved surface having a predetermined curvature.

In an embodiment, when the electronic device 8000 is in an intermediate state, the first side member 8011 and the second side member 8021 may be disposed at a certain angle to each other. The surface of the first area 861 and the surface of the second area 862 of the display 860 may configure an angle greater than that of the folded state and smaller than that of the unfolded state. At least a portion of the folding area 863 may be configured of a curved surface having a predetermined curvature, and the curvature may be smaller than that in a folded state.

Figure 9:
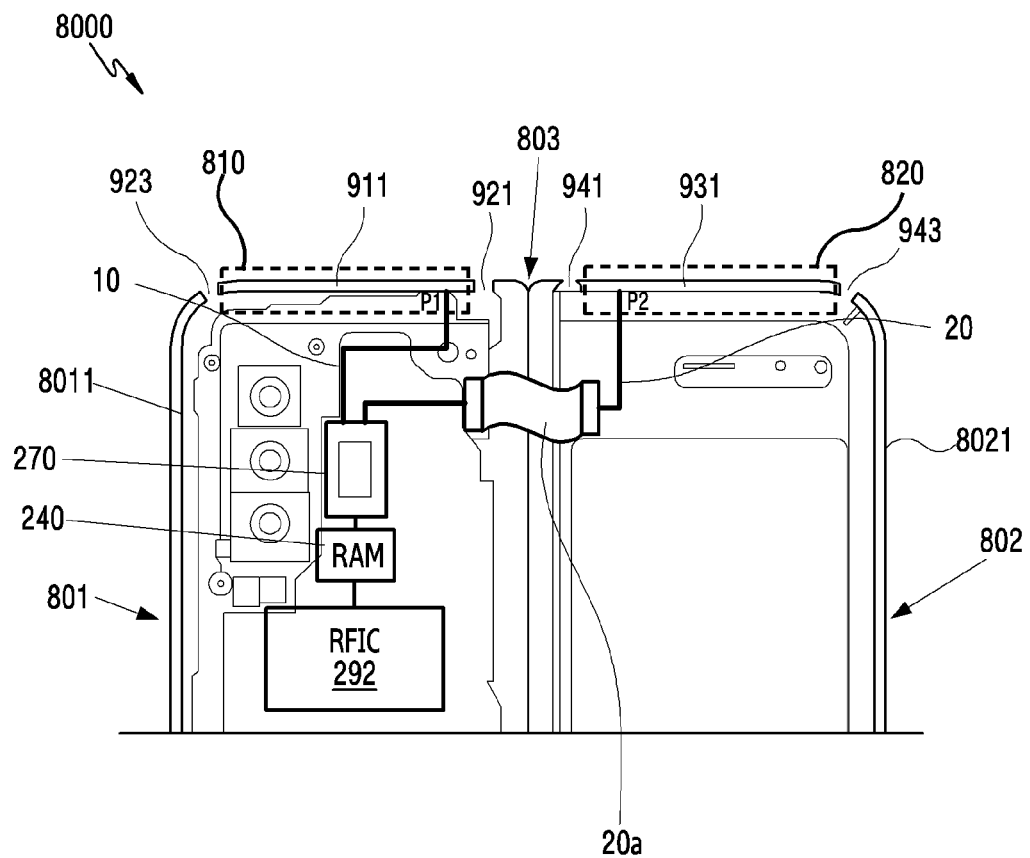
FIG. 9 illustrates an electronic device including an antenna structure according to an embodiment.

FIG. 9 illustrates an electronic device including an antenna structure according to an embodiment.

Referring to FIGS. 8A, 8B, and 9 together, the electronic device 8000 according to an embodiment may include a first antenna 810 and a second antenna 820. According to an embodiment, the electronic device 8000 may be folded or unfolded about the connector 803. The same reference numerals are used for the same or substantially the same components as those described above, and overlapping descriptions are omitted.

Referring to FIG. 9, a first portion 911 of the first side member 8011 may embody a portion of one edge of the first side member 8011. In an embodiment, the first part 911 may be fed from a radio frequency integrated circuit (RFIC) 292 at the first point P1 through the first path 10 and may operate as the first antenna 810 for transmitting and/or receiving RF signals of a designated band. In an embodiment, the first portion 911 may include a conductive material.

In an embodiment, a first segmented portion 921 may be configured at one end of the first portion 911, and a second segmented portion 923 may be configured at the other end of the first portion 911. The first segmented portion 921 and the second segmented portion 923 may separate the first portion 911 configured of a conductive material from other portions of the first side member 8011. In an embodiment, the first segmented portion 921 and/or the second segmented portion 923 may include a material having a specified dielectric constant or a non-conductive material (e.g., air or resin).

According to an embodiment, a second portion 931 of the second side member 8021 may configure a portion of one edge of the second side member 8021. In an embodiment, the second part 931 may be fed from the radio frequency integrated circuit (RFIC) 292 at the second point P2 through the second path 20 and may operate as the second antenna 820 for transmitting and/or receiving RF signals of a designated band. In an embodiment, the second portion 931 may include a conductive material. In an embodiment, the second path 20 may include a flexible printed circuit board RF cable (FRC) 20a crossing the connector 803.

In an embodiment, a third segmented portion 941 may be configured at one end of the second portion 931, and a fourth segmented portion 943 may be configured at the other end of the second portion 931. The third segmented portion 941 and the fourth segmented portion 943 may separate the second portion 931 from other portions of the second side member 8021. In an embodiment, the third segmented portion 941 and the fourth segmented portion 943 may include a material having a specified dielectric constant or a non-conductive material (e.g., air or resin).

The electronic device 8000 according to an embodiment may include a power amplifier module (PAM) 240 disposed in an electrical path between the power distribution circuit 270 and the RFIC 292. The PAM 240 may include, for example, a power amplifier for amplifying a signal provided from the RFIC 292.

In an embodiment, the first part 911 and the second part 931 may correspond to each other. For example, the first part 911 and the second part 931 may be positioned at the same edge when the electronic device 8000 is unfolded. As another example, the first part 911 and the second part 931 may overlap each other in the folded state of the electronic device 8000. For example, when viewed from above the rear surface of the first part 801 in the folded state of the electronic device 8000, the first part 911 may overlap the second part 931.

In an embodiment, the first point P1 of the first portion 911 and the second point P2 of the second portion 931 may correspond to each other. For example, in the folded state of the electronic device 8000, the first point P1 of the first part 911 may substantially overlap the second point P2 of the second part 931. For example, the first point P1 and the second point P2 may overlap when viewed from the rear surface of the first part 801 in the folded state of the electronic device 8000.

In an embodiment, the power distribution circuit 270 may equally provide power supplied from the RFIC 292 to the first portion 211 and the second portion 212. According to an embodiment, the power distribution circuit 270 may provide power to the first portion 211 through the first path 10 and provide power to the second portion 212 through the second path 20.

For example, the electronic device 8000 according to an embodiment may provide the first signal and the second signal having the same phase to each other to the first portion 911 and the second portion 931 using the power distribution circuit 270.

According to an embodiment, an antenna structure 300 includes a first antenna 341, a second antenna 342, at least one processor, a power distribution circuit equally supplying power supplied from the at least one processor to the first antenna 341 and the second antenna 342, and a coupler 301 disposed between the at least one processor and the power distribution circuit 320, wherein the at least one processor obtains a first parameter for a first signal received by the first antenna 341 and a second parameter for a second signal received by the second antenna 342, detects a phase difference between the first signal and the second signal, obtains a matching parameter based on parameters corresponding to a case in which the phase difference satisfies a specified condition among the first parameter and the second parameter, and obtains a third parameter for allowing a reflection coefficient of a signal flowing from the power distribution circuit 320 to the coupler 301 to exist within a specified range among the matching parameters.

According to an embodiment, the antenna structure 300 may include a memory connected to the at least one processor, and the at least one processor may store the third parameter in the memory.

According to an embodiment, the antenna structure 300 may include a first tuner 331 disposed between the first antenna 341 and the power distribution circuit 320, and the at least one processor may be configured to control the phase of the first signal through the first tuner 331 based on the third parameter stored in the memory.

According to an embodiment, the antenna structure 300 may further include a second tuner 332 disposed between the second antenna 342 and the power distribution circuit 320, and the at least one processor may be configured to control the phase of the second signal through the second tuner 332 based on the third parameter stored in the memory.

According to an embodiment, the first tuner 331 and the second tuner 332 may include a variable capacitor and a switch.

According to an embodiment, the antenna structure may include a first switch 311 disposed between the coupler 301 and the power distribution circuit 320, and a second switch 312 disposed between the first switch 311 and the power distribution circuit 320 and the first antenna 341, wherein the first switch 311 may be configured such that the coupler 301 is selectively connected to the power distribution circuit 320 or the second switch 312, and the second switch 312 may be configured such that the first antenna 341 is selectively connected to the power distribution circuit 320 or the first switch 311.

According to an embodiment, the first parameter and the second parameter may include at least one of a reflection coefficient, a return loss, or a voltage standing wave ratio (VSWR) of the first signal and the second signal, respectively.

According to and embodiment, the specified condition is that the phase difference between the first signal and the second signal is 45 degrees or less.

According to an embodiment, a correction method for optimizing antenna performance may include obtaining a first parameter for a first signal and a second parameter for a second signal, detecting a phase difference between the first signal and the second signal according to the obtained first parameter and the second parameter, obtaining a matching parameter based on parameters corresponding to a case in which the phase difference satisfies a specified condition among the first parameter and the second parameter, and obtaining a third parameter for allowing reflection coefficients of the first signal and the second signal to exist within a specified range among the matching parameters.

According to an embodiment, the obtaining of the matching parameter further includes obtaining a chart including the phase difference according to the first parameter and the second parameter.

According to an embodiment, the obtaining of the matching parameter may include obtaining at least a portion of the first parameter and the second parameter corresponding to a case in which the phase difference in the chart is 45 degrees or less.

According to an embodiment, the obtaining the first parameter and the second parameter may include obtaining the first parameter in a state where the second parameter is fixed as an arbitrary parameter, and obtaining the second parameter in a state where the first parameter is fixed as an arbitrary parameter.

According to an embodiment, the correction method may further include storing the third parameter in a memory, and controlling a phase of the first signal and/or the second signal based on the stored third parameter.

According to an embodiment, the correction method may include sensing the reflection coefficient, which is substantially equal for the first signal and the second signal.

According to an embodiment, the first parameter and the second parameter may include at least one of a reflection coefficient, a return loss, or a voltage standing wave ratio (VSWR) of the first signal and the second signal, respectively.

According to an embodiment, an electronic device 101 may include a housing including a first part, a second part coupled to the connector so as to be rotatable with respect to the first part, and a connector disposed between the first part and the second part, a first antenna 341 including a first portion of the first part, a second antenna 342 including a second portion of the second part, wherein when the housing is folded, a first point of the first antenna 341 corresponds to a second point of the second antenna 342, at least one processor, a power distribution circuit 320 equally supplying power supplied from the at least one processor to the first antenna 341 and the second antenna 342, and a coupler 301 disposed between the at least one processor and the power distribution circuit, wherein the at least one processor may obtain a first parameter for a first signal received by the first antenna 341 and a second parameter for a second signal received by the second antenna 342, may detect a phase difference between the first signal and the second signal, may obtain a matching parameter based on parameters corresponding to a case in which the phase difference satisfies a specified condition among the first parameter and the second parameter, and may obtain a third parameter for allowing a reflection coefficient of a signal flowing from the power distribution circuit 320 to the coupler 301 to exist within a specified range among the matching parameters.

According to an embodiment, the electronic device 101 may include a first switch 311 disposed between the coupler 301 and the power distribution circuit 320, and a second switch 312 disposed between the first switch 311 and the power distribution circuit 320 and the first antenna 341, wherein the first switch 311 may be configured such that the coupler 301 is selectively connected to the power distribution circuit 320 or the second switch 312, and the second switch 312 may be configured such that the first antenna 311 is selectively connected to the power distribution circuit 320 or the first switch 311.

According to an embodiment, the electronic device 101 may include a memory coupled to the at least one processor, and the at least one processor may be configured to store the third parameter in the memory.

According to an embodiment, the electronic device 101 may include a first tuner 331 disposed between the first antenna 341 and the power distribution circuit 320, and the at least one processor may be configured to control the first tuner 331 based on the third parameter stored in the memory.

According to an embodiment, the electronic device 101 may include a second tuner 332 disposed between the second antenna 342 and the power distribution circuit 320, and the at least one processor may be configured to control the first tuner 331 and/or the second tuner 332 based on the third parameter stored in the memory.

Although the present disclosure has been described with various embodiments, various changes and modifications may be suggested to one skilled in the art. It is intended that the present disclosure encompass such changes and modifications as fall within the scope of the appended claims.

What is claimed is:

1. An antenna structure comprising:
   a first antenna;
   a second antenna;
   at least one processor;
   a power distribution circuit configured to equally supply power supplied from the at least one processor to the first antenna and the second antenna; and
   a coupler disposed between the at least one processor and the power distribution circuit,
   wherein the at least one processor is configured to:
      obtain a first parameter for a first signal received by the first antenna and a second parameter for a second signal received by the second antenna;
      detect a phase difference between the first signal and the second signal;
      obtain matching parameters, based on parameters corresponding to cases in which the phase difference satisfies a specified condition among the first parameter and the second parameter; and
      obtain a third parameter for allowing a reflection coefficient of a signal flowing from the power distribution circuit to the coupler to exist within a specified range among the matching parameters.

2. The antenna structure of claim 1, comprising a memory coupled to the at least one processor,
   wherein the at least one processor stores the third parameter in the memory.

3. The antenna structure of claim 2, comprising a first tuner disposed between the first antenna and the power distribution circuit,
   wherein the at least one processor controls a phase of the first signal through the first tuner, based on the third parameter stored in the memory.

4. The antenna structure of claim 3, comprising a second tuner disposed between the second antenna and the power distribution circuit,
   wherein the at least one processor controls a phase of the second signal through the second tuner, based on the third parameter stored in the memory.

5. The antenna structure of claim 4, wherein each of the first tuner and the second tuner comprises a variable capacitor and a switch.

6. The antenna structure of claim 1, comprising:
   a first switch disposed between the coupler and the power distribution circuit, and
   a second switch disposed between the first switch and the power distribution circuit and the first antenna,
   wherein the first switch is configured to selectively connect the coupler to the power distribution circuit or the second switch, and
   wherein the second switch is configured to selectively connect the first antenna to the power distribution circuit or the first switch.

7. The antenna structure of claim 1, wherein the first parameter includes at least one of a reflection coefficient, a return loss, or a voltage standing wave ratio (VSWR) of the first signal, and
   wherein the second parameter includes at least one of a reflection coefficient, a return loss, or a voltage standing wave ratio (VSWR) of the second signal.

8. The antenna structure of claim 1, wherein the specified condition is that the phase difference between the first signal and the second signal is 45 degrees or less.

9. A correction method for optimizing antenna performance, comprising:
 obtaining a first parameter for a first signal and a second parameter for a second signal;
 detecting a phase difference between the first signal and the second signal according to the obtained first parameter and the second parameter;
 obtaining matching parameters, based on parameters corresponding to cases in which the phase difference satisfies a specified condition among the first parameter and the second parameter; and
 obtaining a third parameter for allowing reflection coefficients of the first signal and the second signal to exist within a specified range among the matching parameters.

10. The correction method of claim 9, wherein the obtaining the matching parameters further comprises obtaining a chart including the phase difference according to the first parameter and the second parameter.

11. The correction method of claim 10, wherein the obtaining the matching parameters comprises obtaining at least a portion of the first parameter and the second parameter corresponding to cases in which the phase difference in the chart is 45 degrees or less.

12. The correction method of claim 9, wherein the obtaining the first parameter and the second parameter comprises:
 obtaining the first parameter in a state where the second parameter is fixed as an arbitrary parameter, and
 obtaining the second parameter in a state where the first parameter is fixed as an arbitrary parameter.

13. The correction method of claim 9, further comprising:
 storing the third parameter in a memory; and
 controlling a phase of the first signal and/or the second signal, based on the stored third parameter.

14. The correction method of claim 9, comprising detecting the reflection coefficient, which is substantially equal for the first signal and the second signal.

15. The correction method of claim 9, wherein the first parameter comprises at least one of a reflection coefficient, a return loss, or a voltage standing wave ratio (VSWR) of the first signal, and
 wherein the second parameter comprises at least one of a reflection coefficient, a return loss, or a voltage standing wave ratio (VSWR) of the second signal.

16. An electronic device comprising:
 a housing, wherein the housing comprises:
 a first part;
 a second part; and
 a connecting part disposed between the first part and the second part, the first part being coupled to the connecting part so as to be rotatable with respect to the second part;
 a first antenna including a first portion of the first part;
 a second antenna including a second portion of the second part, a first point of the first antenna corresponding to a second point of the second antenna when the housing is folded;
 at least one processor;
 a power distribution circuit configured to equally supply power supplied from the at least one processor to the first antenna and the second antenna; and
 a coupler disposed between the at least one processor and the power distribution circuit, and
 wherein the at least one processor is configured to:
 obtain a first parameter for a first signal received by the first antenna and a second parameter for a second signal received by the second antenna;
 detect a phase difference between the first signal and the second signal;
 obtain matching parameters, based on parameters corresponding to cases in which the phase difference satisfies a specified condition among the first parameter and the second parameter; and
 obtain a third parameter for allowing a reflection coefficient of a signal flowing from the power distribution circuit to the coupler to exist within a specified range among the matching parameters.

17. The electronic device of claim 16, comprising:
 a first switch disposed between the coupler and the power distribution circuit; and
 a second switch disposed between the first switch and the power distribution circuit and the first antenna,
 wherein the first switch is configured to selectively connect the coupler to the power distribution circuit or the second switch, and
 wherein the second switch is configured to selectively connect the first antenna to the power distribution circuit or the first switch.

18. The electronic device of claim 16, comprising a memory coupled to the at least one processor,
 wherein the at least one processor stores the third parameter in the memory.

19. The electronic device of claim 18, comprising a first tuner disposed between the first antenna and the power distribution circuit,
 wherein the at least one processor controls the first tuner, based on the third parameter stored in the memory.

20. The electronic device of claim 19, comprising a second tuner disposed between the second antenna and the power distribution circuit,
 wherein the at least one processor controls at least one of the first tuner or the second tuner, based on the third parameter stored in the memory.

* * * * *